United States Patent [19]
Oh

[11] Patent Number: 5,598,011
[45] Date of Patent: Jan. 28, 1997

[54] THIN FILM TRANSISTOR AND METHOD OF MAKING THE SAME

[75] Inventor: Eui Y. Oh, Kwacheon-si, Rep. of Korea

[73] Assignee: Goldstar Co., Ltd., Seoul, Rep. of Korea

[21] Appl. No.: 376,923

[22] Filed: Jan. 23, 1995

Related U.S. Application Data

[62] Division of Ser. No. 56,773, May 4, 1993, Pat. No. 5,409,851.

[30] Foreign Application Priority Data

| May 4, 1992 | [KR] | Rep. of Korea | 7604 |
| May 25, 1992 | [KR] | Rep. of Korea | 8880 |
| May 27, 1992 | [KR] | Rep. of Korea | 9085 |
| May 28, 1992 | [KR] | Rep. of Korea | 9155 |

[51] Int. Cl.$^6$ ................................. H01L 29/04
[52] U.S. Cl. ....................... 257/57; 257/66; 257/411
[58] Field of Search .................. 257/57, 59, 66, 257/366, 411

[56] References Cited

U.S. PATENT DOCUMENTS

| 5,034,340 | 7/1991 | Tanaka et al. | 437/41 |
| 5,102,813 | 4/1992 | Kobayashi et al. | 437/41 |
| 5,120,667 | 6/1992 | Torui et al. | 437/40 |
| 5,231,039 | 7/1993 | Sakono et al. | 437/41 |
| 5,240,869 | 8/1993 | Nakatani | 437/41 |
| 5,266,825 | 11/1993 | Tsukada et al. | 257/57 |
| 5,340,999 | 8/1994 | Takeda et al. | 257/411 |

Primary Examiner—Mark V. Prenty

[57] ABSTRACT

A thin film transistor and a method of making the same, capable of reducing the step height between an insulating substrate and a gate electrode upon the anodization and thus preventing a short circuit at overlapping portions of the gate electrode and source/drain electrodes. The thin film transistor comprises a first metal layer as a gate electrode formed on an insulating substrate, an anodizable second metal layer having a line width larger than that of the first metal layer so as to cover the first metal layer, and an anodized film as a first gate insulating film formed by anodizing the second metal layer. The gate electrode and the anodized film serve as a gate insulating film. The gate insulating film can be also provided by forming a metal layer with a proper thickness over the insulating substrate, primarily anodizing a portion of the metal layer, forming a gate pattern forming layer over the anodized metal layer portion, and secondarily anodizing the metal layer except for its portion disposed beneath the gate pattern forming layer, to form a gate electrode. The anodized films are used as the gate insulating film.

25 Claims, 20 Drawing Sheets

1

THIN FILM TRANSISTOR AND METHOD OF MAKING THE SAME

This application is a divisional of application Ser. No. 08/056,773, filed on May 4, 1993 now U.S. Pat. No. 5,409,851, the entire contents of which are hereby incorporated by reference.

BACKGROUND OF THE INVENTION

1. Field of the Invention

The present invention relates to a thin film transistor and a method of making the same, and more particularly to a thin film transistor for a liquid crystal display device (LCD) and a method of making the same.

2. Description of the Prior Art

Thin film transistors are widely used as switching elements for LCDs.

FIG. 1 is a schematic sectional view of an example of conventional thin film transistor. As shown in FIG. 1, the thin film transistor comprises an insulating substrate 11 over which a metal layer for a gate electrode is deposited. At one side of the substrate 11, a gate electrode 12 is provided, which is formed by patterning the metal layer. Over the entire upper surface of the resulting structure are deposited a gate insulating film 13 and an amorphous silicon film 14 in this order. The amorphous silicon film 14 is patterned, so as to provide an amorphous silicon film pattern above the gate electrode 12. A transparent electrode 15 is disposed on the gate insulating film 13 such that it is spaced from the amorphous silicon film 14. On the gate insulating film 13, a drain electrode 16 is also disposed such that it is overlapped with one upper surface portion of the amorphous silicon film 14 and an upper surface portion of the transparent electrode 15 facing the one upper surface portion of amorphous silicon film 14. A source electrode 17 is also disposed on the gate insulating film 13. The source electrode 17 is overlapped with the other upper surface portion of the amorphous silicon film 14. Over the entire upper surface of the resulting structure is formed a non-active layer 18 as a passive layer for the thin film transistor. Thus, the structure shown in FIG. 1 is obtained.

For improving the characteristics and yield of thin film transistors with the above-mentioned structure, there have been also proposed other thin film transistors such as a thin film transistor with a double gate insulating film structure including two gate insulating films 23-1 and 23-2 as shown in FIG. 2 and a thin film transistor with a double gate electrode structure including two gate electrodes 32-1 and 32-2 as shown in FIG. 3. They use glass substrates or quartz substrates as their insulating substrates 21 and 31. For gate electrodes 22 and 32, metals such as Al, Ta, Ti and Nb or alloys thereof are used. Also, a transparent anodized film made of $Al_2O_5$ or $T_2O_5$ is used as one gate insulating film 23-1 of the double insulating film structure. As the other gate insulating film 23-2, a nitride film made of SiN or an oxide film made of $SiO_2$ is used.

For fabricating the double gate insulating film structure of the thin film transistor shown in FIG. 2, first, over an insulating substrate 21 is deposited an anodizable metal layer having a thickness of about 3,000 Å. The metal layer is then subjected to a patterning for forming a metal pattern 22. The metal pattern 22 with the thickness of 3,000 Å is then partially subjected to an anodization, so that its thickness portion of 1,500 Å is anodized to form a first gate insulating film 23-1 with a thickness of about 2,000 Å. The unanodized portion of metal pattern 22 constitutes a gate electrode which has a thickness of about 1,500 Å. After the formation of the first gate insulating film 23-1 by the anode oxidation, a second gate insulating film 23-2 made of a nitride film or oxide film is formed over the upper surface of the resulting structure. Thus, the double gate insulating film structure is obtained.

Where a transparent anodized film is formed as the gate insulating film by using the anodization technique, as mentioned above, and assuming that $D_0$, $D_1$, and $D_2$ in FIG. 4A represent the initial thickness of the metal pattern 22 for gate electrode, the thickness of the portion of metal pattern to be changed into the gate insulating film after the anodization, and the thickness of the unanodized portion of metal pattern to be used as the gate electrode, respectively, the thickness-$D_1$ portion of the metal pattern prior to the anodization is changed into the anodized film 23-1 after the anodization, as shown in FIG. 4B. Actually, the anodized film 23-1 is not identical to the thickness $D_1$ of the metal pattern 22 prior to the anodization, due to the volume expansion occurring during the anodization. Taking the volume expansion coefficient α into consideration, the thickness of anodized film 23-1 is therefore $αD_1$. Accordingly, the step resulting from the formation of the metal pattern, which has an initial height Si of $D_1+D_2$ prior to the anodization, has an increased height after the anodization, that is, a final height $Sf_1$ of $D_1+αD_2$. The volume coefficient α upon the anodization is 1.5 in Al, 2.5 in Ta, and 2.5 in Nb.

As a result, where the double gate insulating film structure is formed using the anodization technique, the step height between the insulating substrate and the gate electrode is increased due to the volume expansion caused by the anodization. Such an increase in step height results in an increase in short circuit generation rate at crossing portions of gate electrode and source/drain electrodes.

On the other hand, the transparent anodized film which is used as the gate insulating film, for improving the characteristics and yield of thin film transistors is formed by a chemical reaction occurring by a current at an anode. Where a plurality of thin film transistors are fabricated on one substrate, anodized films therefor are simultaneously formed under a condition that a plurality of gate electrodes are connected with one another. As a result, if the line width of each gate electrode is very small or irregular due to the gate electrode design or line defects, as shown in FIG. 5A, current flowing through the gate electrodes during the anodization may concentrate on gate electrode portions where the line width is reduced, as shown in FIG. 5B. Moreover, a short circuit may occur among gate electrodes, due to a poor adhesion of gate electrodes to the insulating substrate. Where such a short circuit problem is taken into consideration, the formation of insulating films using the anodization technique encounters a problem of a limitation on line width and line thickness of gate electrodes.

FIG. 6 is a schematic sectional view of an active matrix LCD employing the thin film transistor of FIG. 2.

As shown in FIG. 6, the LCD comprises a lower plate 60, an upper plate 70 and a liquid crystal 80 sealably contained a chamber defined between the lower plate 60 and the upper plate 70.

For fabricating such a LCD, first, on a lower insulating substrate 61 is formed a thin film transistor with the structure of FIG. 2, so as to prepare the lower plate 60. Thereafter, a formation of the upper plate 70 spaced from the lower plate 60 is carried out. For preparing the upper plate 70, first, on a upper insulating substrate 71 is formed a black matrix 72 disposed at a lower surface portion of the upper insulating substrate 71, which corresponds to the thin film transistor. On the entire lower surface of the resulting upper plate structure, an upper common electrode 73 is formed. Thereafter, a liquid crystal 80 is injected into a space defined between the lower plate 60 and the upper plate 70.

The conventional LCD with the above-mentioned structure encounters a reduction in opening rate due to a bonding tolerance occurring upon bonding the lower and upper plates 60 and 70, since the upper plate 70 has the black matrix 72. Furthermore, it also encounters a problem of a degradation in thin film transistor characteristic, since light beams are radiated to the thin film transistor of the lower plate 60 because of a light reflection occurring at the black matrix 72 of upper plate 70.

SUMMARY OF THE INVENTION

Therefore, an object of the invention is to provide a thin film transistor and a method of making the same, capable of solving the short circuit problem caused by the small line width of a gate electrode upon the anodization and increasing the opening rate.

Another object of the invention is to provide a thin film transistor and a method of making the same, capable of reducing the step height between an insulating substrate and a gate electrode upon the anodization and thus preventing a short circuit at overlapping portions of the gate electrode and source/drain electrodes.

In accordance with one aspect, the present invention provides a thin film transistor comprising: an insulating substrate; a metal layer formed on one side portion of said insulating substrate and provided with slant side walls, said metal layer having a predetermined line width; a first insulating film formed on the insulating substrate such that it covers the metal layer, said first insulating film having a line width larger than said line width of the metal layer; a second insulating film formed over the entire upper surfaces of the insulating substrate and the first insulating film; an amorphous silicon film formed on one side portion of said second insulating film disposed above the metal layer; a pixel electrode formed on the other side portion of the second insulating film; a drain electrode formed on the second insulating film such that it is overlapped with both an upper surface of one side portion of said pixel electrode and an upper surface of one side portion of said amorphous silicon film facing said one side portion of the pixel electrode; a source electrode formed on the second insulating film such that it is overlapped with an upper surface of the other side portion of the amorphous silicon film; and a passive film formed over the entire upper surfaces of the resulting structure.

In accordance with another aspect, the present invention provides a method of making a thin film transistor comprising the steps of: forming a first metal layer with slant side walls on one side portion of an insulating substrate, said metal layer having a predetermined line width; forming a second metal layer on the insulating substrate such that it covers the metal layer, said first insulating film having a line width larger than said line width of the metal layer by at least two times; forming a first insulating film; forming a second insulating film over the entire upper surfaces of the resulting structure; forming an amorphous silicon film on one side portion of said second insulating film disposed above the first metal layer; forming a pixel electrode on the other side portion of the second insulating film; forming a drain electrode on the second insulating film such that it is overlapped with both an upper surface of one side portion of said pixel electrode and an upper surface of one side portion of said amorphous silicon film facing said one side portion of the pixel electrode and forming a source electrode on the second insulating film such that it is overlapped with an upper surface of the other side portion of the amorphous silicon film; and forming a passive film over the entire upper surfaces of the resulting structure.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 7:
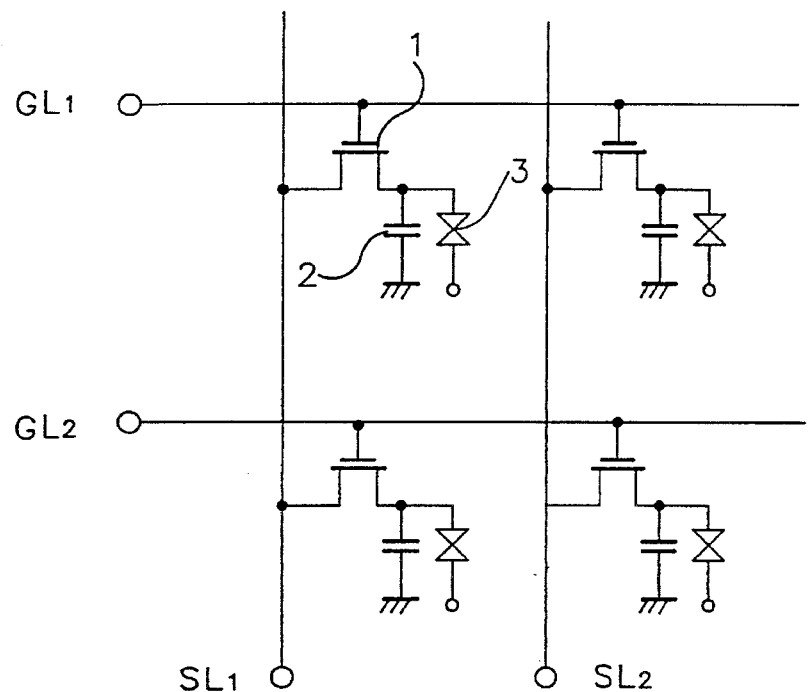
FIG. 7 is an equivalent circuit diagram of an active matrix LCD employing a thin film transistor according to the present invention.

FIG. 7 is an equivalent circuit diagram of an active matrix liquid crystal display device wherein its switching elements are embodied by thin film transistors according to the present invention.

The active matrix LCD comprises a plurality of unit pixels arranged in a matrix manner. Each pixel is constituted by a thin film transistor 1, a charge accumulation condenser 2 and a liquid crystal cell 3. The thin film transistors arranged in each column of the matrix have gate electrodes connected in common to each corresponding one of gate lines GL. As a voltage of a predetermined level is applied to each gate line GL, a current flowing between source and drain terminals of each transistor is controlled to drive each corresponding liquid crystal cell 3 by the applied voltage.

Figure 8:
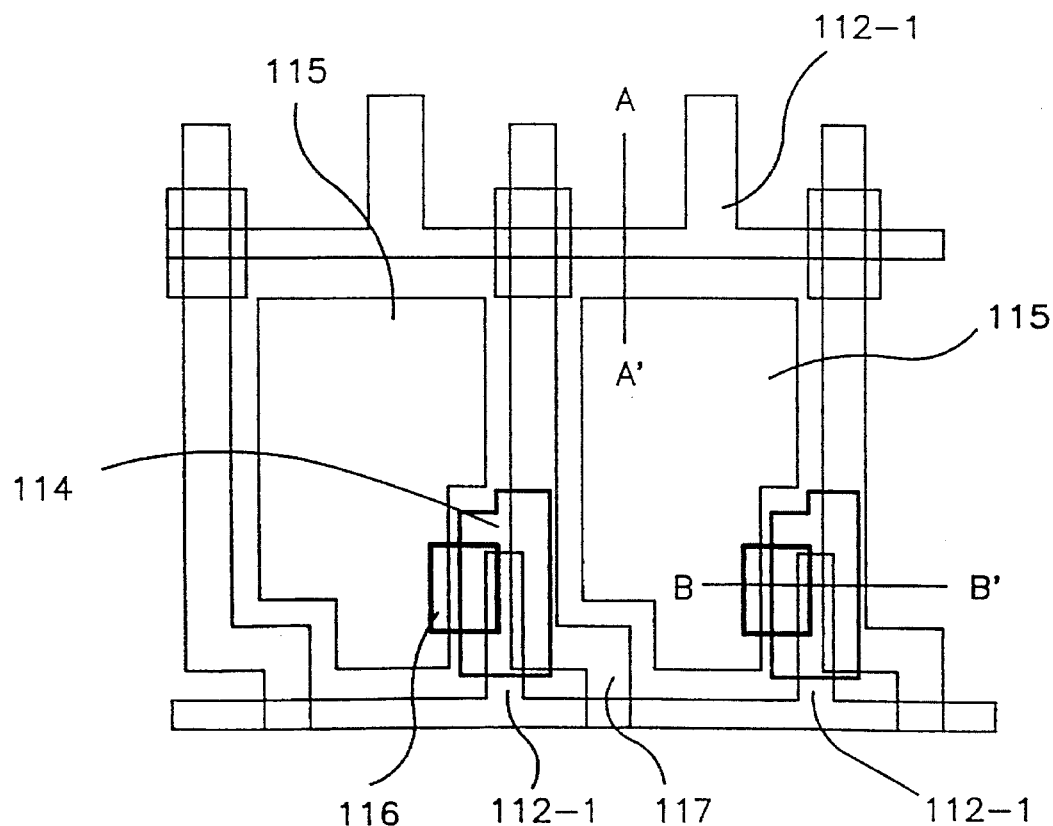
FIG. 8 is a plan view illustrating a layout of the LCD shown in FIG. 7.

Referring to FIG. 8, there is illustrated a layout of the LCD shown in FIG. 7. In FIG. 8, the charge accumulation condensers 2 are not shown, for simplifying the illustration.

On the other hand, FIGS. 9A to 9G are schematic sectional views of a thin film transistor according to a first embodiment of the present invention. The thin film transistor has a structure capable of solving the short circuit problem occurring at its gate electrode due to the small line width of gate electrode upon the anodization and improving the opening rate.

In the thin film transistor, an anodized film as a first gate insulating film is formed on an insulating substrate, to have a line width larger than that of the gate electrode.

Figure 9A:
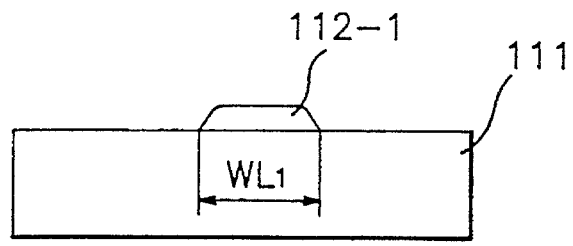
FIGS. 9A to 9G are schematic sectional views of a thin film transistor according to a first embodiment of the present invention.

In accordance with the first embodiment, over an insulating substrate 111 is deposited a metal layer exhibiting a passivity against the oxidation and having a thickness of about 1,000 Å. The metal layer is subsequently subjected to a patterning for forming a first gate electrode 112-1 having a predetermined line width WL1, as shown in FIG. 9A.

Figure 9B:
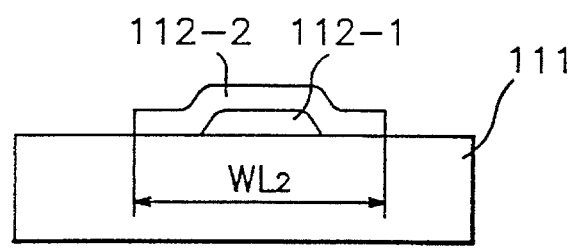

Over the entire upper surface of the resulting structure, a metal layer having a thickness of about 2,000 Å, which is then subjected to a patterning for forming a second gate electrode 112-2 having a line width $WL_2$ larger than the line width $WL_1$ of the first gate electrode 112-1 by two times or more, as shown in FIG. 9B.

For the second gate electrode 112-2, a metal such as Al, Ta, Ti, Si, V, Nb, Hf or Zr is used.

It is preferred that the line widths $WL_1$ and $WL_2$ of the first and second gate electrodes 112-1 and 112-2 are about 5 and about 20 μm, respectively.

Figure 9C:
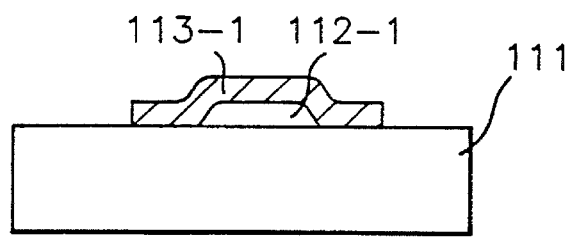

After its formation, the gate electrodes 112-2 is subjected to an anodization, so that it is changed into a transparent anodized film 113-1, as shown in FIG. 9C. During the anodization, the anodized film 113-1 is expanded in volume, thereby causing its thickness to be up to about 3,000 Å.

Thus, only the first gate electrode 112-1 becomes an actual gate electrode, in that during the anodization, only the second gate electrode 112-2 is changed into an anodized film to form the first gate insulating film.

During the anodization, the first gate electrode 112-1 is protected from the anodization, in that it is passive against the anodization. Accordingly, the first gate electrode 112-1 is avoided from line defects which may occur upon depositing the second gate electrode.

Figure 9D:
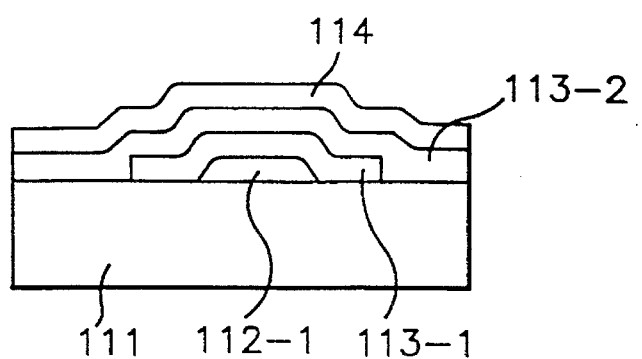
Figure 9E:
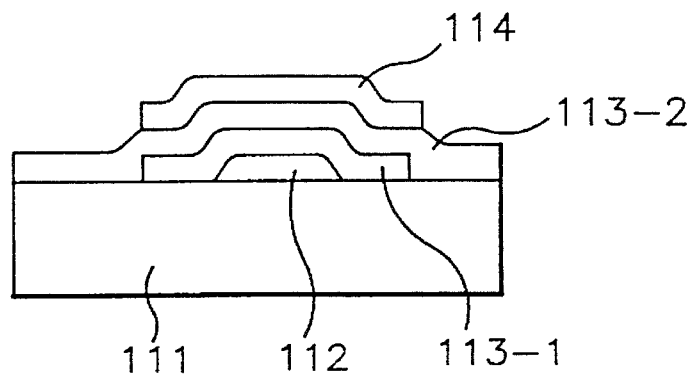

Over the entire upper surface of the resulting structure, a second gate insulating film 113-2 made of a nitride film or an oxide film is deposited to a thickness of about 1,000 Å, as shown in FIG. 9D. Subsequently, an amorphous silicon film 114 is deposited over the second gate insulating film 113-2. The amorphous silicon film 114 is then subjected to a patterning for forming an amorphous silicon film pattern disposed above the first gate electrode 112-1, as shown in FIG. 9E.

Figure 1:
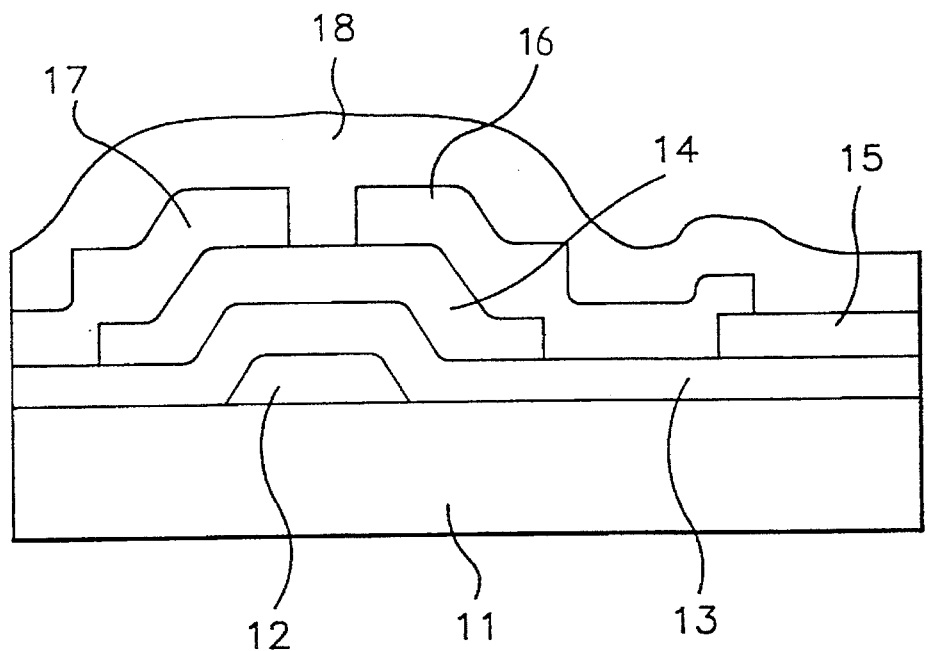
FIG. 1 is a schematic sectional view of a conventional thin film transistor.
Figure 2:
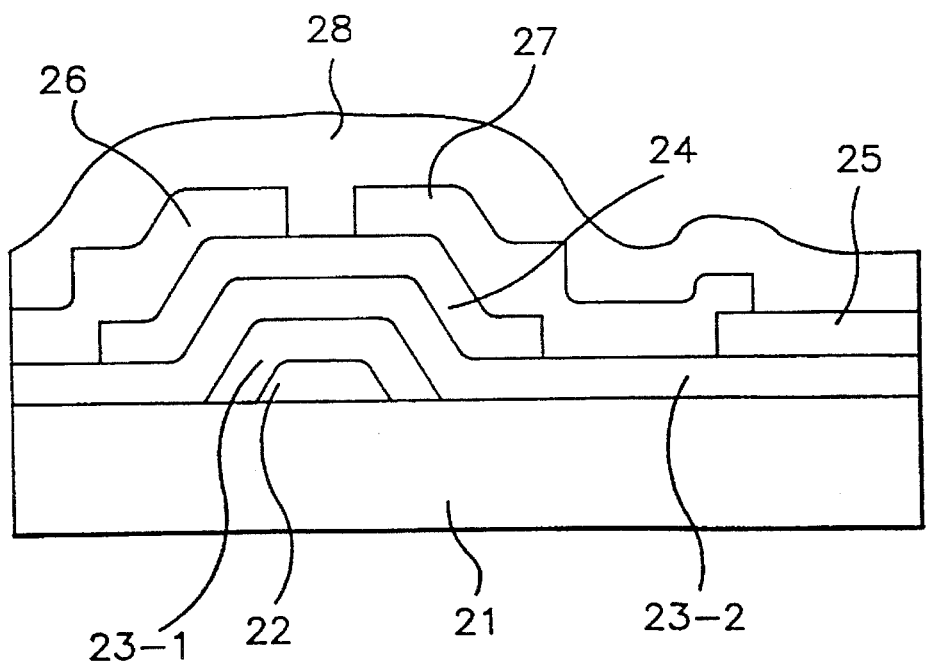
FIG. 2 is a schematic sectional view of a thin film transistor with a conventional double gate insulating structure.
Figure 3:
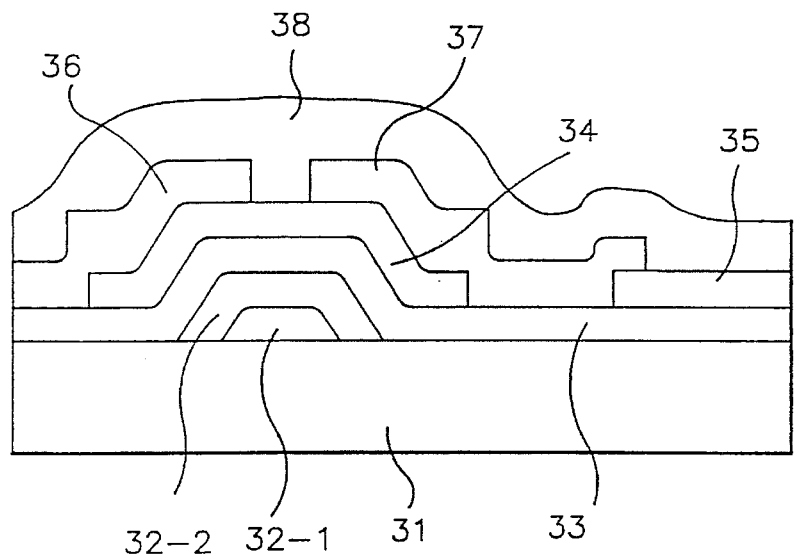
FIG. 3 is a schematic sectional view of a thin film transistor with a conventional double gate structure.
Figure 9F:
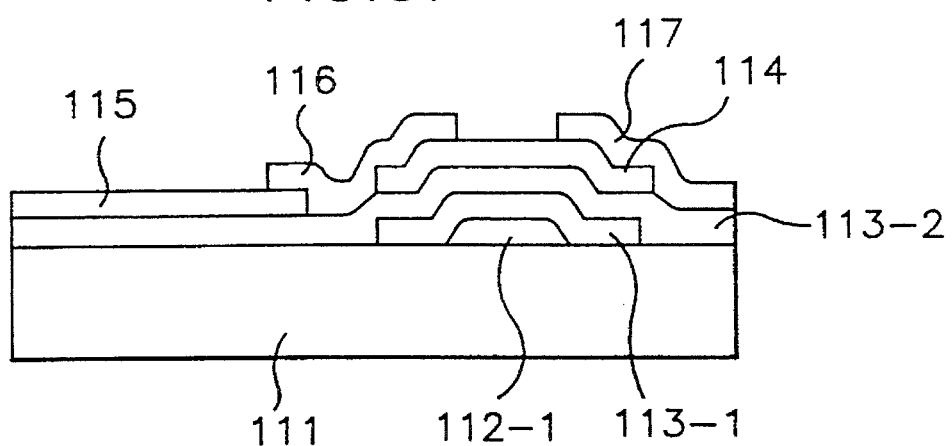
Figure 9G:
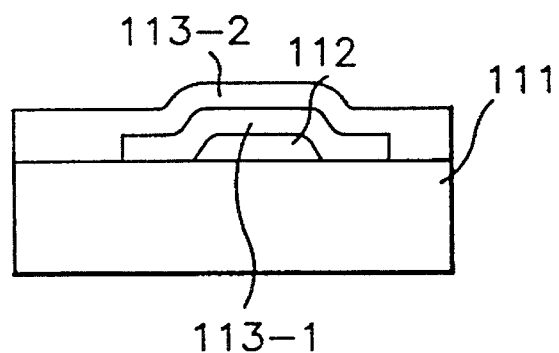
Figure 10A:
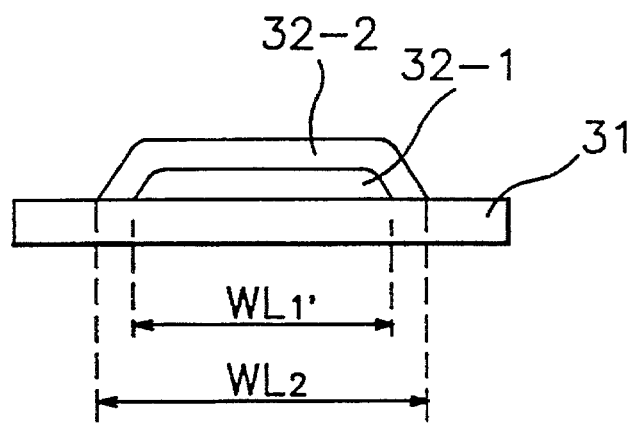
FIGS. 10A to 10C are schematic sectional views for explaining a difference in opening rate between the thin film transistor according to the first embodiment of the present invention and the thin film transistor with the conventional double gate electrode structure.
Figure 10B:
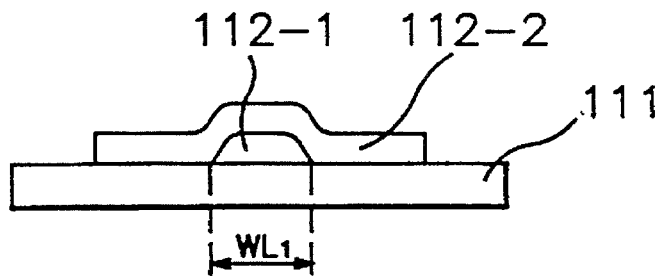
Figure 10C:
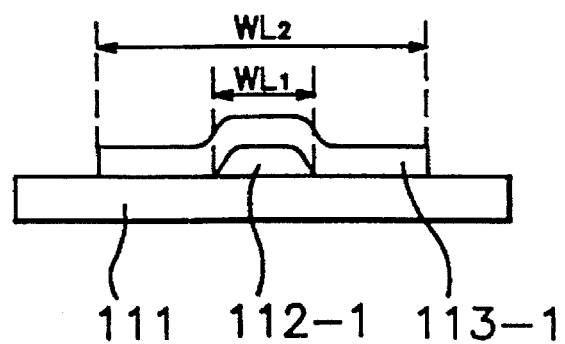

FIG. 9F is a schematic sectional view taken along the line B–B' of FIG. 8, whereas FIG. 9G is a schematic sectional view taken along the line A–A' of FIG. 8. On the other hand, FIGS. 10A to 10C are schematic sectional views for explaining the structural difference between the thin film transistor of FIG. 9F and the thin film transistor with the conventional double gate electrode structure of FIG. 3. FIG. 10A shows the gate electrode structure of the thin film transistor of FIG. 3. FIGS. 10B and 10C show gate constructions before and after the anodization in the thin film transistor of the present invention, respectively.

The structural difference between the thin film transistors of the first embodiment of the present invention and FIG. 3A is the difference in direct contact area between the second gate electrode portion and the lower insulating substrate portion.

In the conventional thin film transistor, the gate electrode structure is constituted by the first gate electrode 32-1 with the line width of $WL_1'$ and the second gate electrode 32-2 with the line width of $WL_2$ and thus has an actual line width of $WL_2$, as shown in FIG. 10A. Prior to the anodization, the thin film transistor of the present invention has the gate electrode structure which is constituted by the first gate electrode 112-1 with the line width of $WL_1$ and the second gate electrode 112-2 with the line width of $WL_2$, in similar to the conventional case. After the second gate electrode 112-2 is totally changed into the anodized film during the anodization, only the first gate electrode with the line width $WL_1$ becomes an actual gate electrode portion. Accordingly, the gate electrode structure of the present invention has an increased opening rate, as compared with the conventional gate electrode structure.

Referring to FIGS. 11A to 11F, there is illustrated a method of making a thin film transistor with a structure according to a second embodiment of the present invention.

In accordance with this method, first, over an insulating substrate 121 is deposited a metal layer 122 for providing a gate electrode. The metal layer 122 is made of an anodizable metal selected from a group consisting of Al, Ta, Ti, Si, V, Nb, Hf, Zr, and alloys thereof. The metal layer 122 has a predetermined thickness of $D_0$.

Figure 11A:
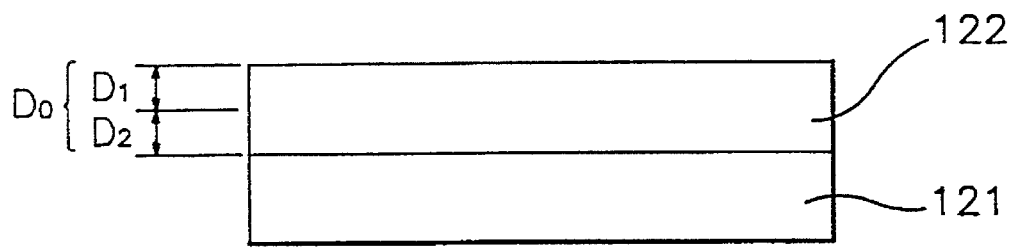
FIGS. 11A to 11F are schematic sectional views illustrating a method of making a thin film transistor with a structure according to a second embodiment of the present invention.
Figure 11B:
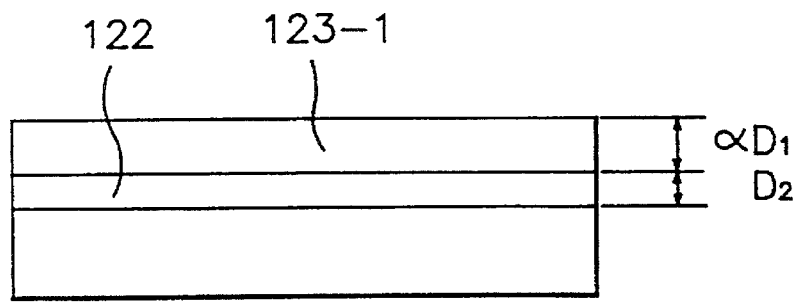

The metal layer 122 with the thickness $D_0$ is then partially subjected to an anodization so that its portion corresponding to a thickness of $D_1$ is anodized to form a first anodized film 123-1 having a thickness of $\alpha D_1$, as shown in FIG. 11B.

Figure 11C:
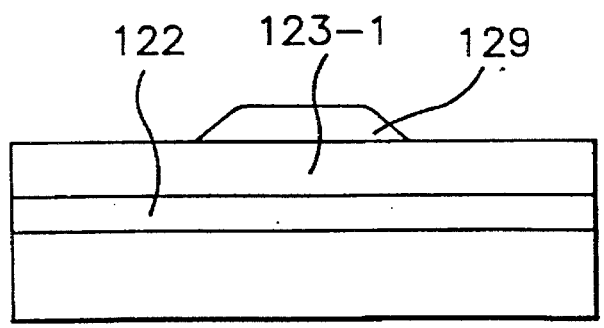
Figure 11D:
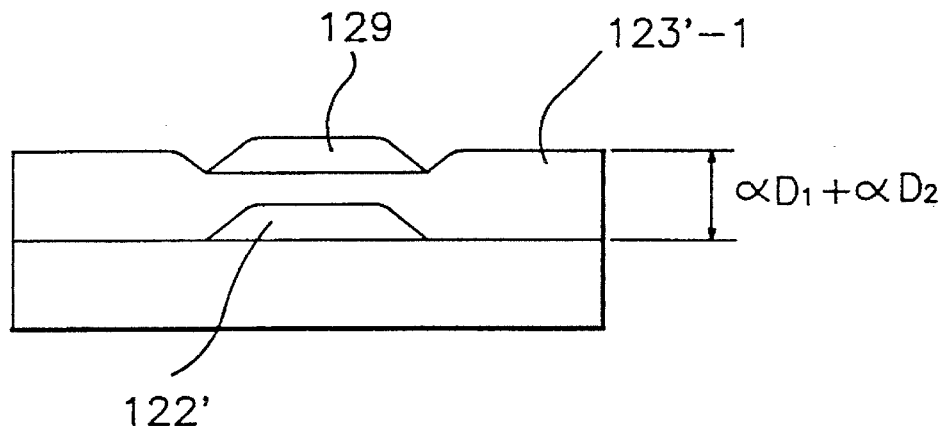

Thereafter, a gate pattern forming layer 129 with a predetermined line width is formed on the first anodized film 123-1 at a position where a gate electrode is formed, as shown in FIG. 11C. Thereafter, the remaining metal layer 122 with a thickness of $D_2$ which has not been changed by the above-mentioned primary anodization is subjected to a secondary anodization. By the secondary anodization, the metal layer 122 is changed into an anodized film, except for its portion disposed beneath the gate pattern forming layer 129. As a result, a first gate insulating film 123'-1 is obtained, which has a thickness of $\alpha D_1+\alpha D_2$, as shown in FIG. 11D.

The remaining metal layer portion 122' not subjected to the anodization becomes a gate electrode and has the same line width as the gate pattern forming layer 129.

The gate pattern forming layer 129 may comprises a single-layered structure constituted by a layer of a single metal such as Cr or Ta, or a single insulating film such as a nitride film or an oxide film. The single-layered structure may be also constituted by a single amorphous silicon film or photoresist polymer film. The gate pattern forming layer 129 also may comprises a double-layered structure constituted by a double-layered metal layer, a double-layered insulating film, or another double-layered structure obtained by combining an insulating film and an amorphous silicon film.

Figure 11E:
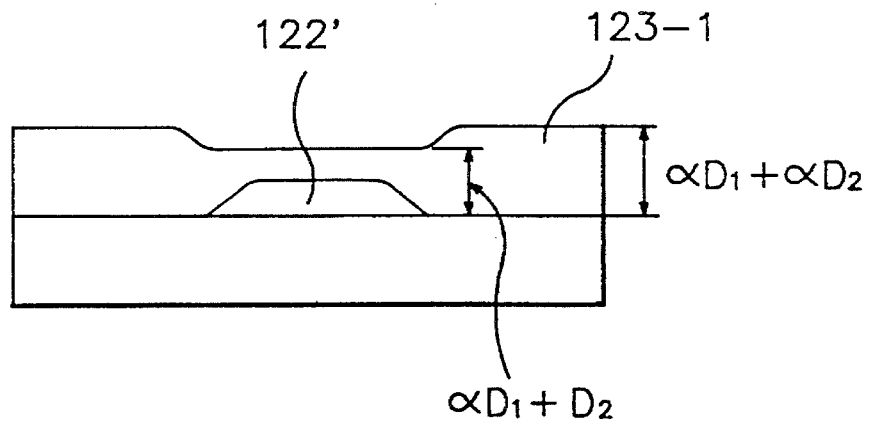

Thereafter, the gate pattern forming layer 129 is removed, as shown in FIG. 11E. After the removal of the gate pattern forming layer 129, the first gate insulating film 123-1 has a recessed structure having a recess at its portion corresponding to the gate electrode 122'. The recess has been formed since the first gate insulating film portion disposed beneath the gate pattern forming layer 129 was not expanded during the anodization.

Figure 11F:
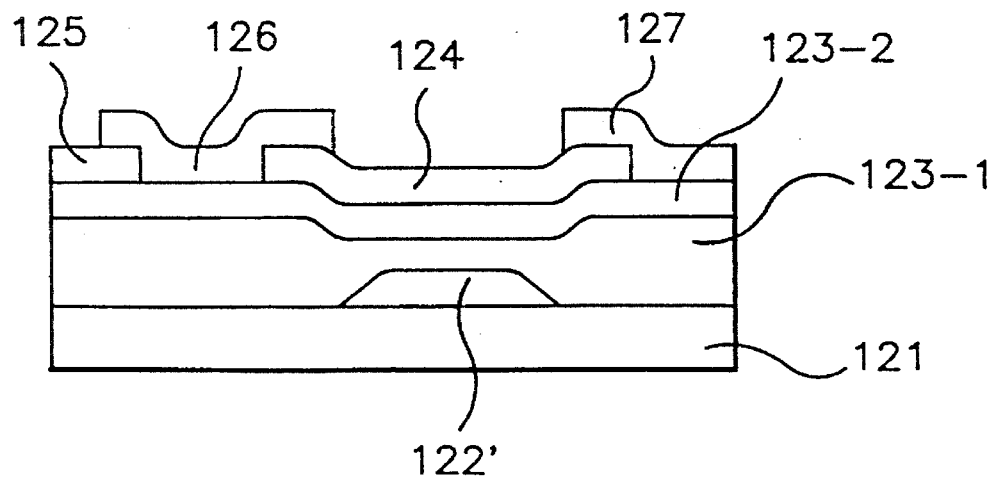

Finally, formations of a second gate insulating layer 123-2, an amorphous silicon film 124, a pixel electrode 125, a drain electrode 126 and a source electrode 127 are carried out. Thus, a thin film transistor with the structure of FIG. 11F is obtained.

Figure 4:
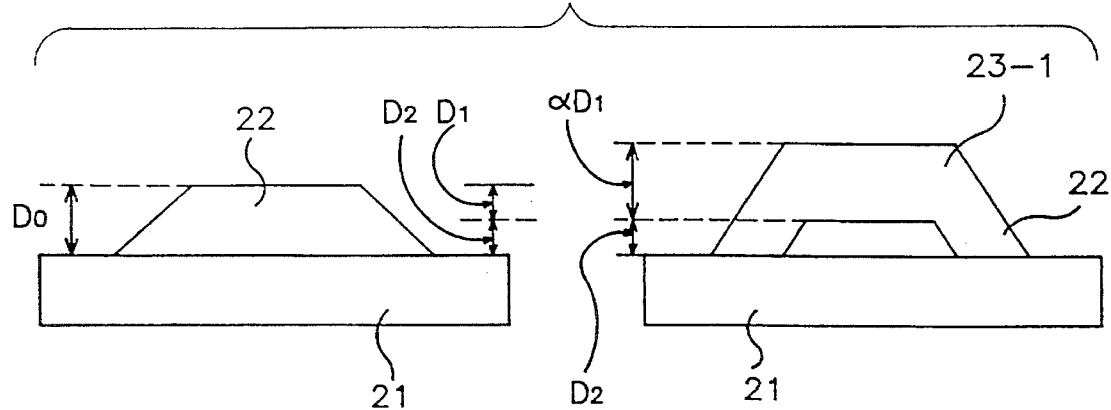
FIG. 4 is a schematic sectional view for explaining steps formed between a gate electrode and an insulating substrate due to an anodization.
Figure 5A:
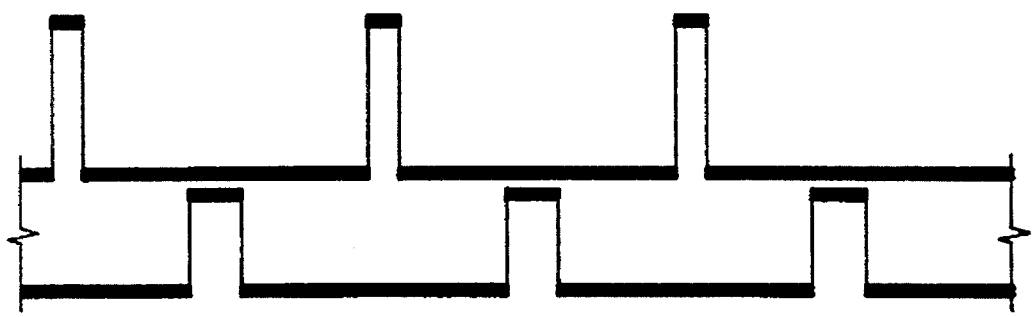
FIGS. 5A and 5B are views for explaining a short circuit caused by a variation in line width of gate electrodes during an anodization.
Figure 5B:
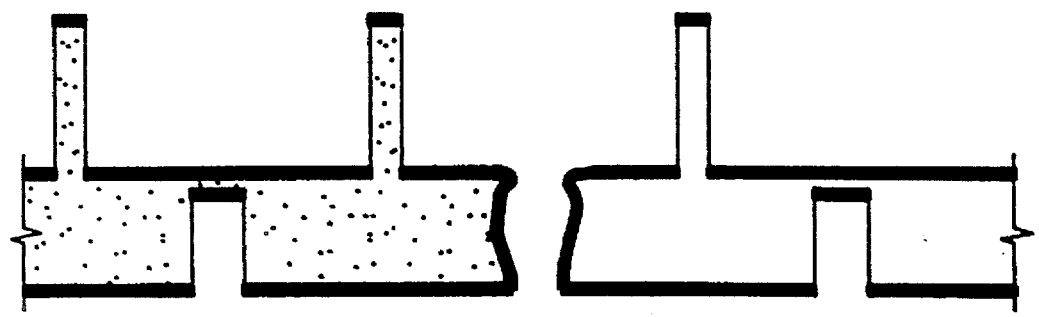
Figure 6:
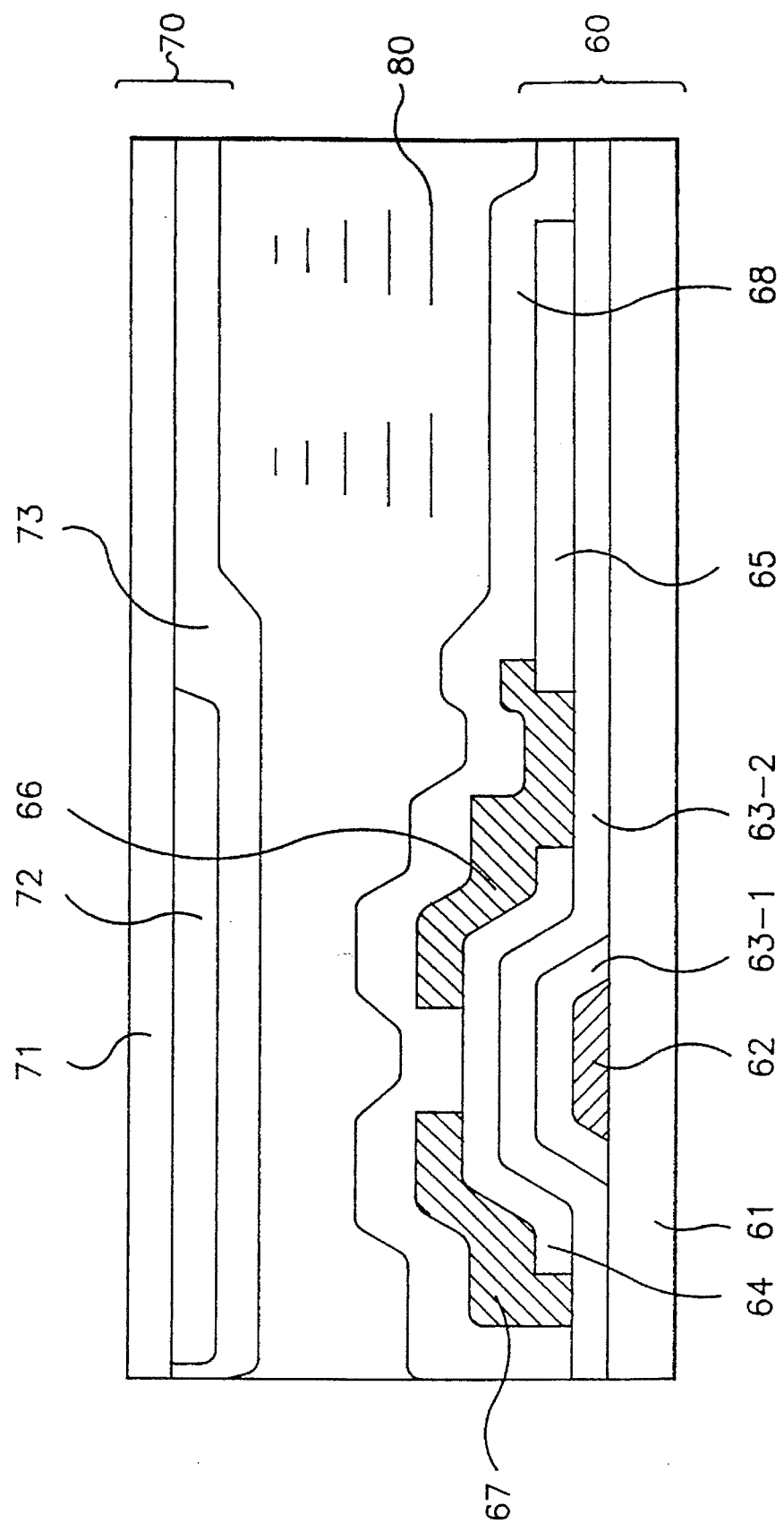
FIG. 6 is a schematic sectional view of an active matrix LCD employing the thin film transistor of FIG. 2.

In the obtained thin film transistor, the final step height $Sf_2$ is $D_2(\alpha-1)$, in that the anodized film, namely, the first fate insulating film 123-1 is $\alpha D_1+\alpha D_2$, as shown in FIG. 11E. However, the final step height $Sf_1$ of the conventional thin film transistor shown in FIG. 4B is $\alpha D_1+D_2$. Where the volume coefficient $\alpha$ is less than 2, accordingly, the final step height $Sf_2$ of the conventional thin film transistor is less than the final step height $Sf_2$ of the thin film transistor according to the present invention. Even at the volume coefficient of 2 or above, the final step height $Sf_1$ is still less than the final step height $Sf_2$, because $\alpha D_1$ is increased.

For example, where a metal layer for providing a gate electrode is deposited using Al, to have an initial thickness of 3,000 Å including $D_1$ of 2,000 Å and $D_2$ of 1,000 Å, the final step height becomes about 500 Å in $Sf_2$ and about 4,000 Å in $Sf_1$.

Although the gate electrode is formed by the double anodization for the metal layer in accordance with the second embodiment, it may be formed by using a double structure including a metal layer and an insulating layer. In this case, the double structure is subjected to a single anodization, for forming the gate electrode.

Referring to FIGS. 12A to 12F, there is illustrated a method of making a thin film transistor with a structure according to a third embodiment of the present invention. In accordance with the third embodiment, an anodization for a metal layer is achieved using a second gate insulating film, without a formation of a gate pattern forming layer.

Figure 12A:
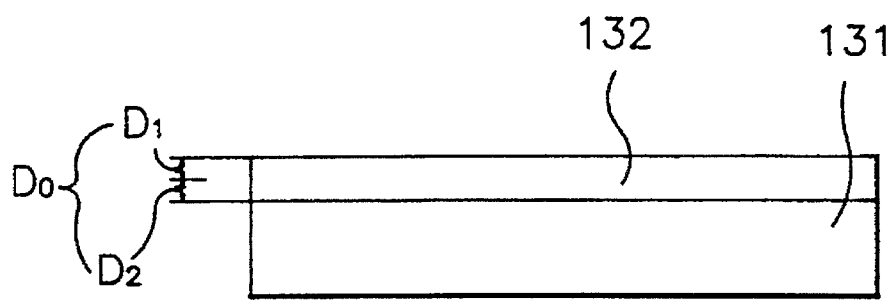
FIGS. 12A to 12F are schematic sectional views illustrating a method of making a thin film transistor with a structure according to a third embodiment of the present invention.
Figure 12B:
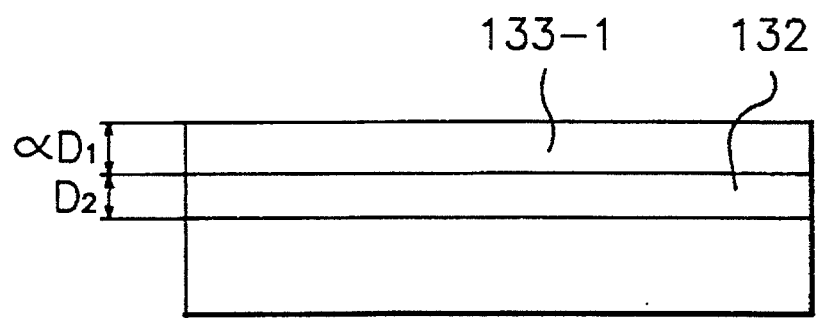

In accordance with the method of the third embodiment, first, over an insulating substrate 131 is deposited an anodizable metal layer 132 for providing a gate electrode. The metal layer 132 has a predetermined thickness of $D_0$. The metal layer 132 with the thickness $D_0$ is then partially subjected to an anodization so that its portion corresponding to a thickness of $D_1$ is anodized to form an anodized film 133-1 having a thickness of $\alpha D_1$, as shown in FIG. 12B.

The metal layer 132 is made of a metal selected from a group consisting of Al, Ta, Ti, Si, V, Nb, Hf, Zr, and alloys thereof.

Figure 12C:
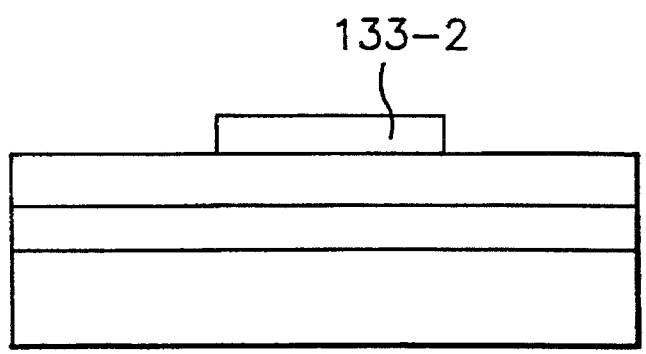
Figure 12D:
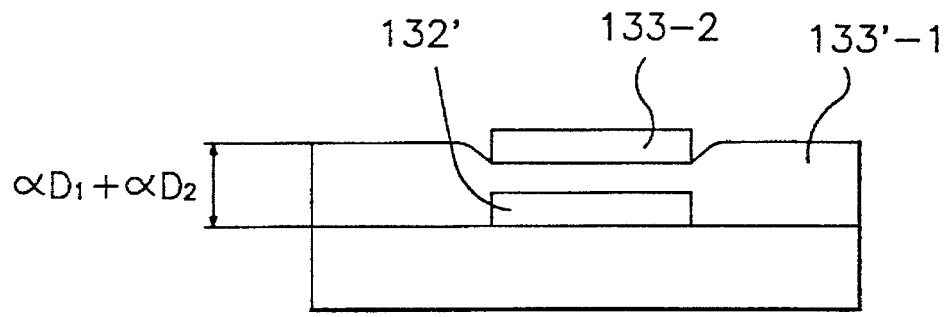

Over the entire upper surface of the resulting structure, a second gate insulating film 133-2 is formed which is, in turn, subjected to a patterning for forming a pattern with a line width identical to that of a gate metal pattern to be formed at a subsequent step, as shown in FIG. 12C. Thereafter, the metal layer 132 is subjected to a secondary anodization. By the secondary anodization, the metal layer 122 is changed into a transparent anodized film, except for its portion disposed beneath the second gate insulating film 133-2. As a result, a first gate insulating film 133'-1 is obtained, which has a thickness of $\alpha D_1+\alpha D_2$, as shown in FIG. 12D.

The remaining metal layer portion 132' not subjected to the anodization becomes a gate electrode.

Figure 12E:
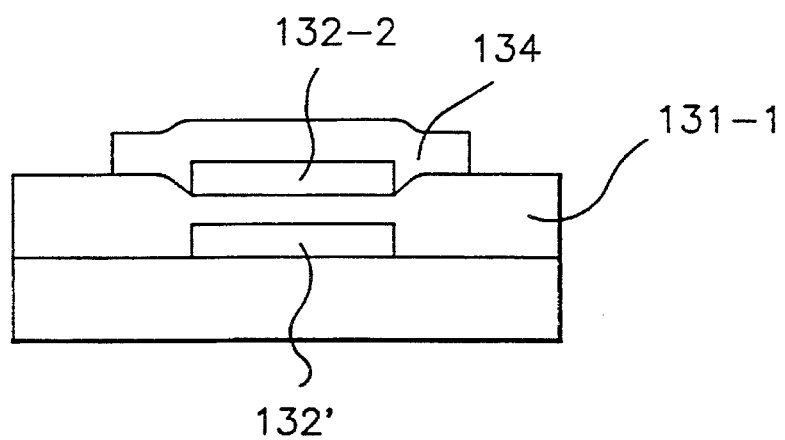
Figure 12F:
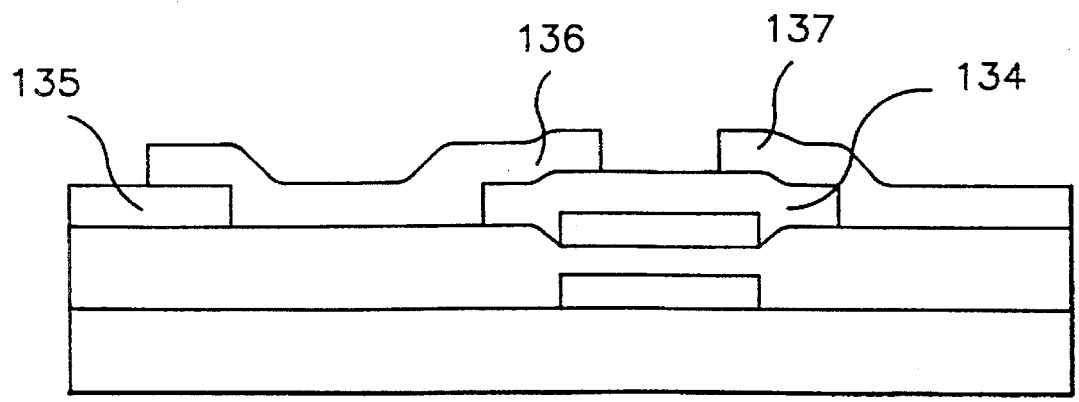

An amorphous oxide film 134 is then formed such that it covers the second gate insulating film 133-2, as shown in FIG. 12E. Finally, formations of a pixel electrode 135, a drain electrode 136 and a source electrode 137 are carried out, so as to obtain a thin film transistor with the structure of FIG. 12F.

In accordance with both the second embodiment and the third embodiment, an anodized film is formed by forming a gate pattern forming layer or a gate insulating film on a metal layer and anodizing the metal layer under a condition of utilizing the gate pattern forming layer or the gate insulating film. The metal layer portion remaining after the anodization serves as the gate electrode, whereas the anodized film serves as the gate insulating film. Accordingly, a structure including no step is obtained.

Referring to FIGS. 13A to 13G, there is illustrated a method of making a thin film transistor with a structure according to a fourth embodiment of the present invention.

Figure 13A:
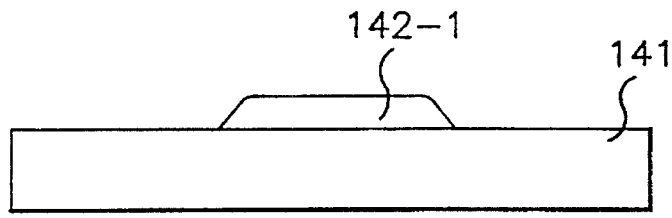
FIGS. 13A to 13G are schematic sectional views illustrating a method of making a thin film transistor with a structure according to a fourth embodiment of the present invention.

In accordance with the method of the fourth embodiment, first, over an insulating substrate 141 is deposited a metal layer 142-1 for providing a first gate electrode. The metal layer 142-1 has a thickness of 2,000 to 3,000 Å. The metal layer 142-1 is then subjected to a patterning for forming a first gate electrode pattern, as shown in FIG. 13A.

Figure 13B:
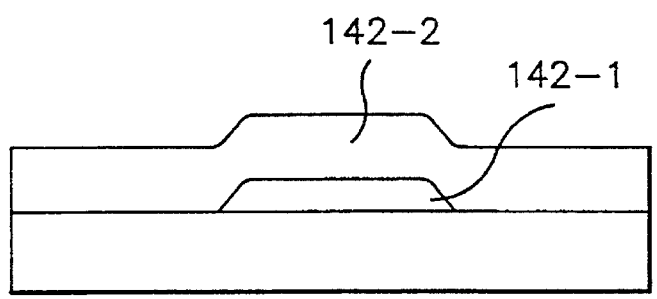
Figure 13C:
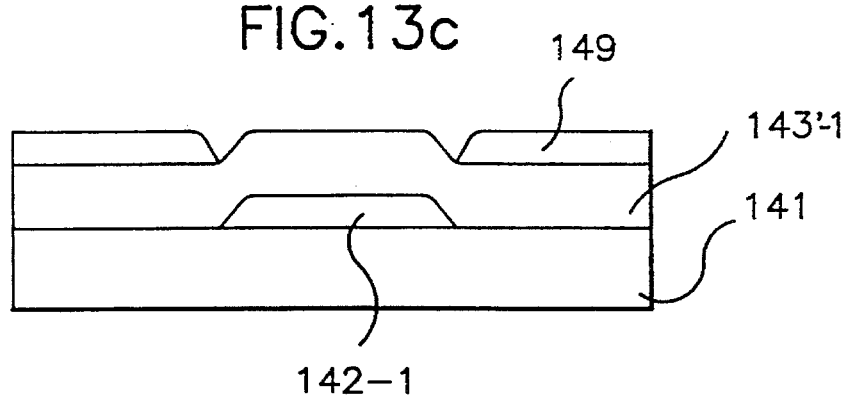

Over the entire upper surface of the resulting structure, an anodizable metal layer 142-2 for providing a second gate electrode is deposited to a thickness of 2,000 to 3,000 Å, as shown in FIG. 13B. The metal layer 142-2 is then subjected to an anodization, so as to form an anodized film 143'-1, as shown in FIG. 13C.

Thereafter, over the entire upper surface of the resulting structure, a photoresist film 149 is coated which is, in turn, subjected to a photo etching for removing its portion disposed above the first gate electrode pattern 142-1.

Figure 13D:
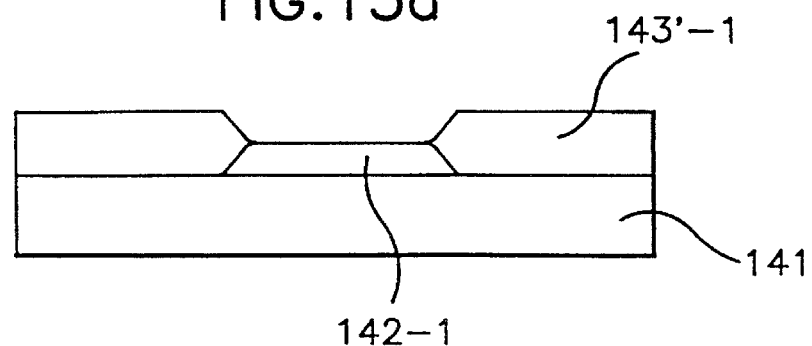

Using the photoresist film 149 as a mask, an exposed portion of the first anodized film 143'-1 is then removed, so as to remove steps formed at the first anodized film 143'-1. Then, the photoresist film 149 is removed, as shown in FIG. 13D.

Figure 13E:
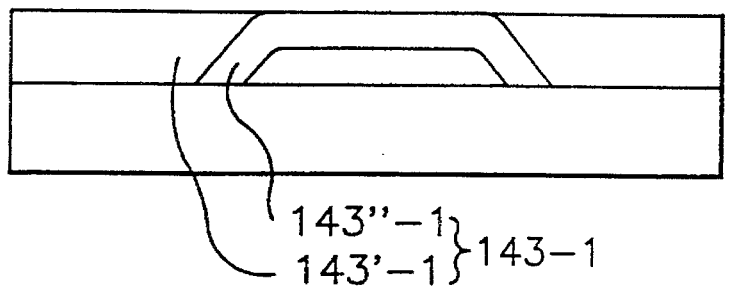

Thereafter, the exposed first gate electrode 142-1 is partially subjected to an anodization for forming a second anodized film 143"-1. After the anodization, a first gate insulating film 143-1 is obtained which is constituted by the first anodized film 143'-1 and the second anodized film 143"-1. As shown in FIG. 13E, the first gate insulating film 143-1 has an even upper surface by virtue of a volume expansion of the anodized film 142-1 occurring during the anodization.

Figure 13F:
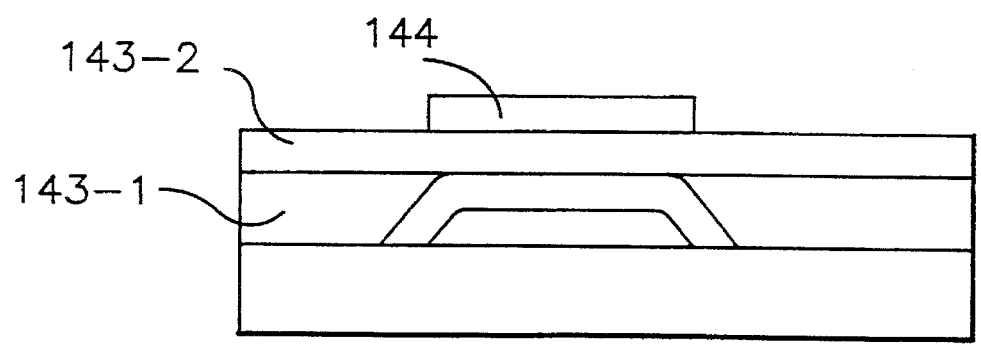

Over the upper surface of the first gate insulating film 143-1 are deposited a second gate insulating film 143-2 and an amorphous silicon film 144, in this order, as shown in FIG. 13F. Thereafter, the amorphous silicon film 144 is patterned, so as to form its pattern.

Figure 13G:
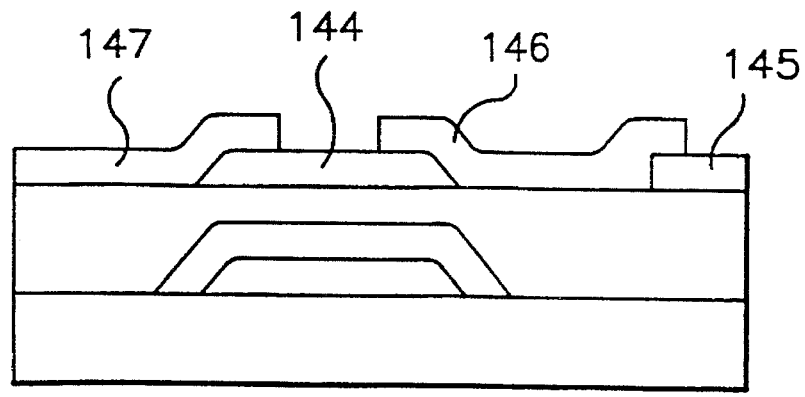

Finally, formations of a pixel electrode 145, a drain electrode 146 and a source electrode 147 are carried out, so as to obtain a thin film transistor with the structure of FIG. 13G.

Figure 14:
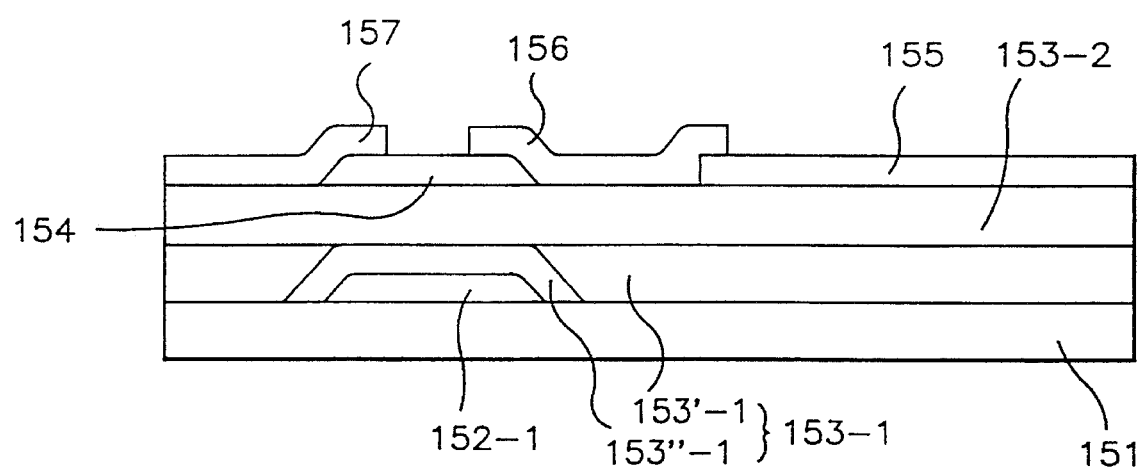
FIG. 14 is a schematic sectional view illustrating a method of making a thin film transistor with a structure according to a fifth embodiment of the present invention.

Referring to FIG. 14, there is illustrated a method of making a thin film transistor with a structure according to a fifth embodiment of the present invention. The fifth embodiment uses a passive layer 159, in place of the second gate electrode.

In accordance with this method, first, over an insulating substrate 151 is deposited a metal layer 152 which is, in turn subjected to a patterning for forming a metal layer pattern 152-1 for providing a gate electrode. The metal layer 152 is made of an anodizable metal selected from a group consisting of Al, Ta, Ti, Si, V, Nb, Hf, Zr, and alloys thereof. The metal layer 122 has a thickness of 2,000 to 3,000 Å.

An insulating film 159 having a thickness of 3,000 to 4,000 Å is then formed. The insulating film 159 is adapted for protecting the substrate 151 and preventing a short circuit at the gate electrode during the anodization. Thereafter, a formation of a photoresist pattern is carried out in a manner as shown in FIG. 13C of the third embodiment. Using the photoresist film pattern as a mask, the insulating film 159 is subjected to an etching for removing its portion disposed above the gate electrode pattern. According to the etching, steps are completely removed.

As the insulating film 159, an oxide film or a nitride film is used. Thereafter, a metal layer 152 for providing a gate electrode is formed, which is, in turn, subjected to an anodization for forming a first gate insulating film 153-1.

Subsequent processes are the same as those of the fourth embodiment.

Referring to FIGS. 15A to 15F, there is illustrated a method of making a thin film transistor with a structure according to a sixth embodiment of the present invention.

Figure 15A:
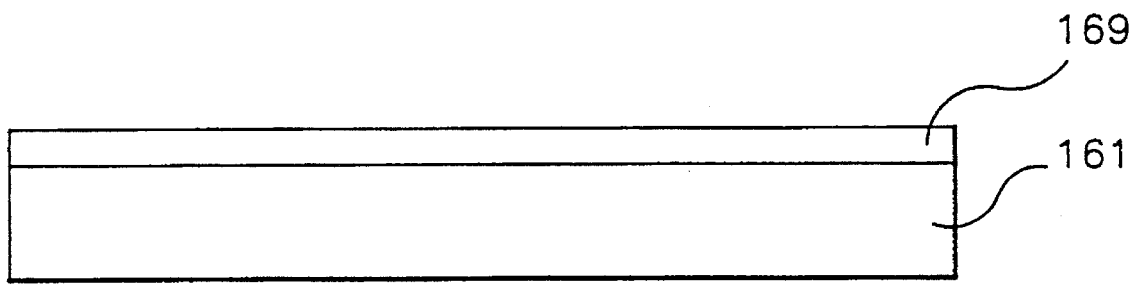
FIGS. 15A to 15F are schematic sectional views illustrating a method of making a thin film transistor with a structure according to a sixth embodiment of the present invention.
Figure 15B:
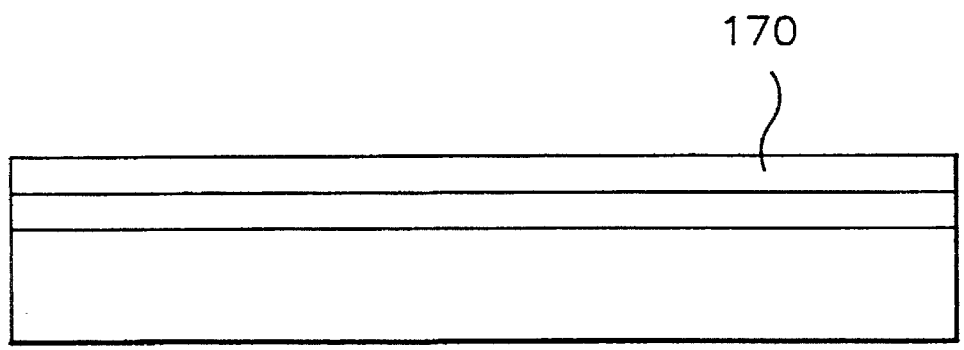

In accordance with this method, first, over an insulating substrate 161 is deposited a metal layer 169 of a predetermined thickness, which will be used as a black matrix, as shown in FIG. 15A. The metal layer 169 is then partially subjected to an anodization, so that it is changed into an anodized film 170, as shown in FIG. 15B.

Figure 15C:
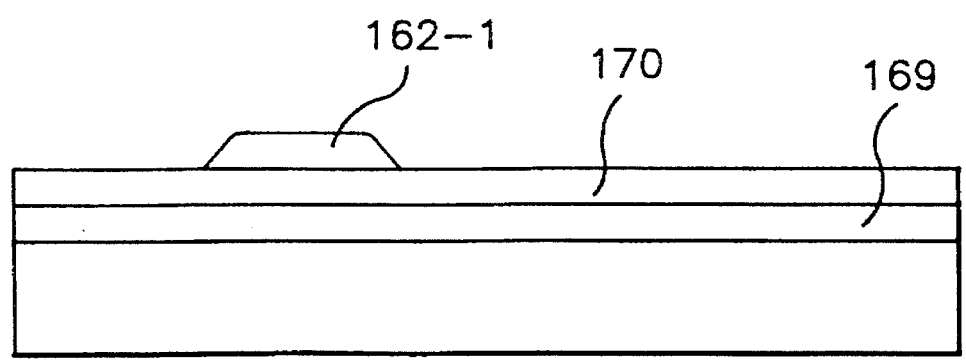

Thereafter, another metal layer 162-1 for providing a first gate electrode is formed on the anodized film 170, to have a predetermined line width, as shown in FIG. 15C.

Figure 15D:
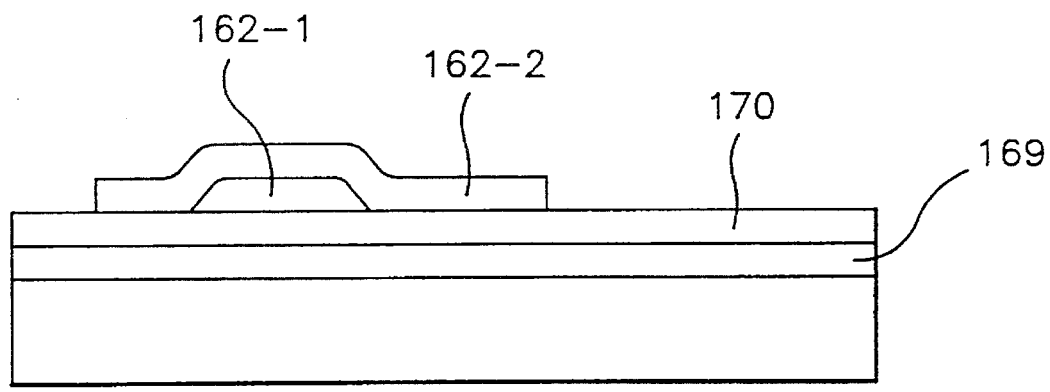

Over the entire upper surface of the resulting structure, another metal layer 162-2 for providing a second gate electrode is deposited, which is, in turn, subjected to a patterning for forming its pattern having the same line width as a black matrix pattern which will be subsequently formed, as shown in FIG. 15D.

Figure 15E:
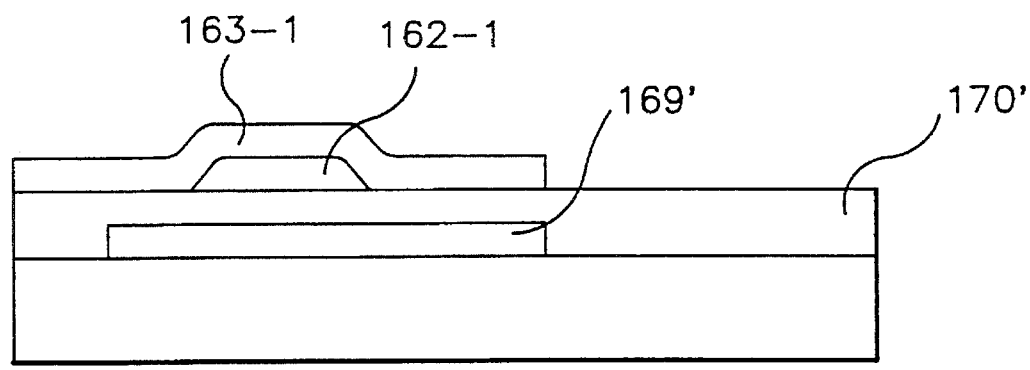
Figure 15F:
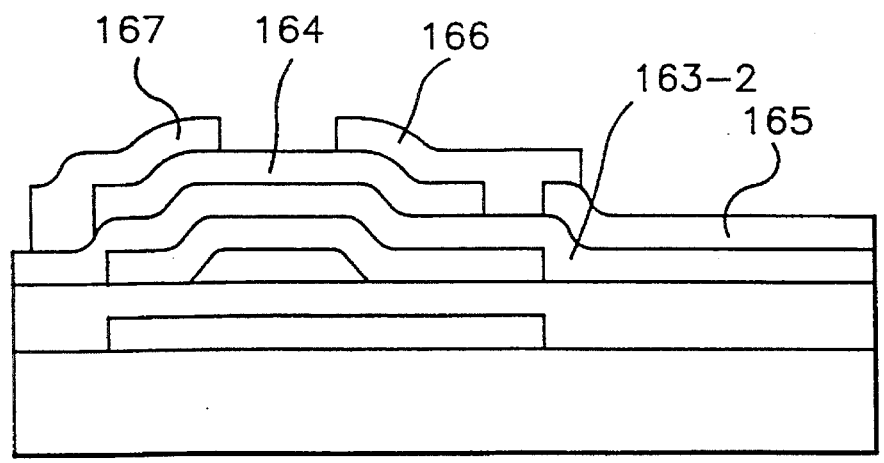

The second gate electrode metal layer 162-2 is then subjected to a secondary anodization so that it is totally changed into an anodized film which provides a first gate insulating film 163-1, as shown in FIG. 15E. By the secondary anodization, the metal layer 169 remaining at an unanodized state is also changed into an anodized film, except for its portion disposed beneath the first gate insulating film 163-1, thereby forming an insulating film 170'. The metal layer 169' remaining at an unanodized state after the secondary anodization becomes the black matrix.

Subsequent processes are the same as those of the fourth embodiment.

In the thin film transistor according to the sixth embodiment, the line width of the first gate insulating film 163-1 and the line width of the black matrix formed after the secondary anodization are the same.

Figure 16A:
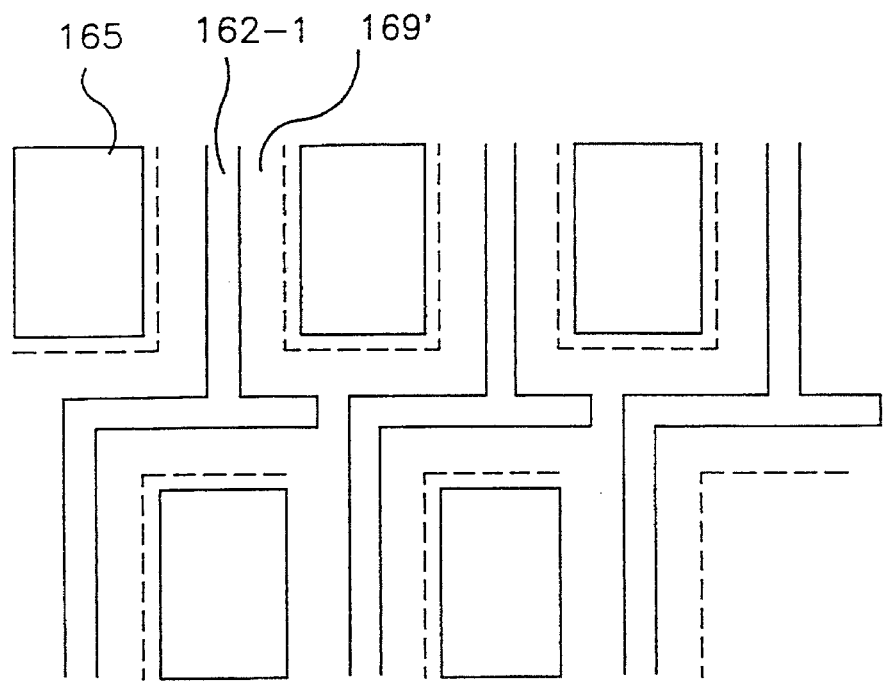
FIGS. 16A and 16B are views illustrating different black matrix structures which are employed in the thin film transistor according to the sixth embodiment of the present invention, respectively.
Figure 16B:
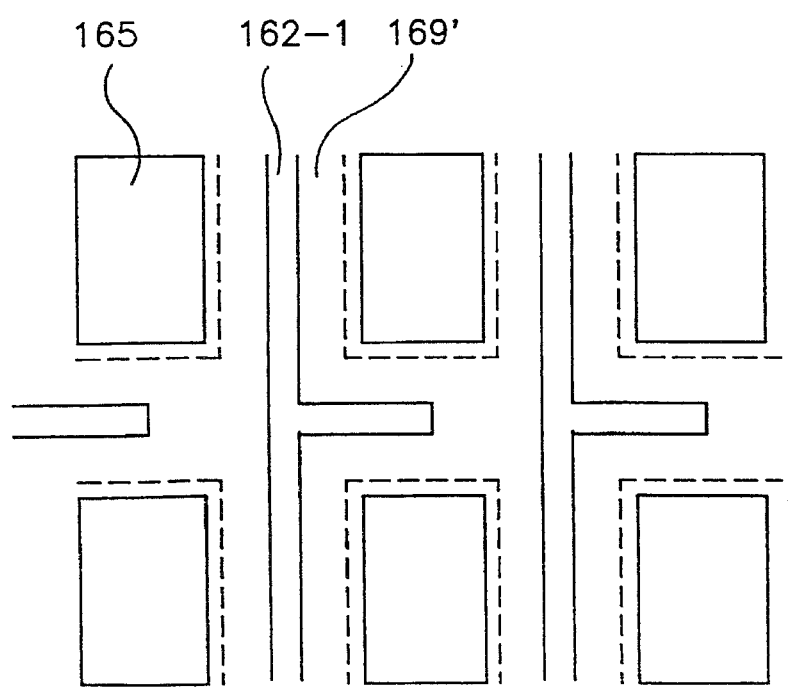

FIGS. 16A and 16B are views illustrating different black matrix structures which are employed in the thin film transistor according to the sixth embodiment, respectively. FIG. 16A shows a case employing a curved type gate wiring structure, whereas FIG. 16B shows a case employing a straight type gate wiring structure.

Figure 17A:
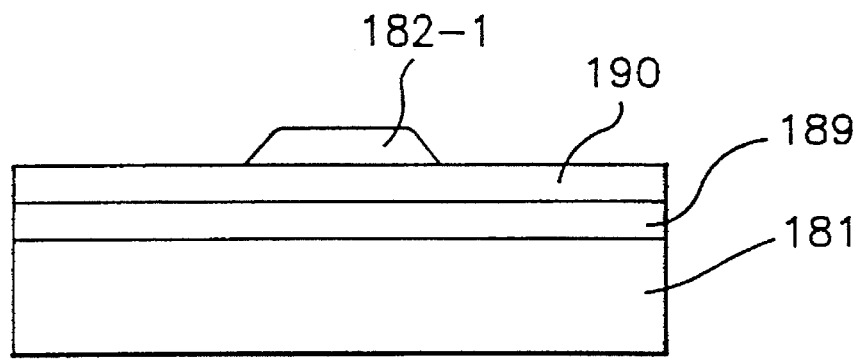
FIGS. 17A to 17C are schematic sectional views illustrating a method of making a thin film transistor with a structure according to a seventh embodiment of the present invention.
Figure 17B:
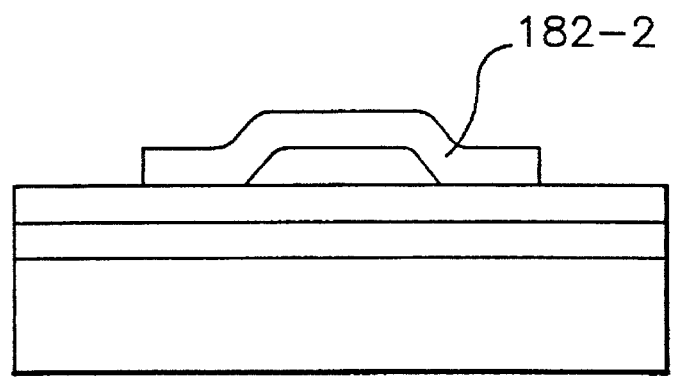
Figure 17C:
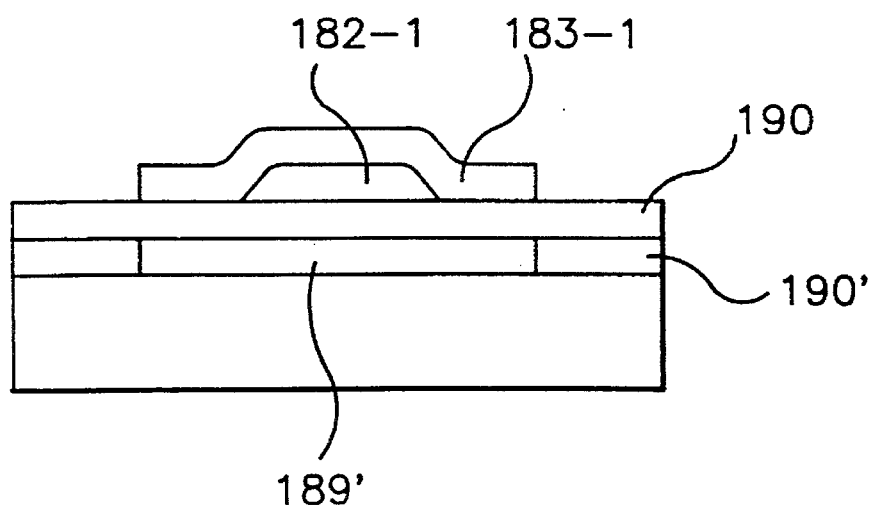

Referring to FIGS. 17A to 17C, there is illustrated a method of making a thin film transistor with a structure according to a seventh embodiment of the present invention.

In accordance with this method, first, over an insulating substrate 181 is deposited a metal layer 189 for providing a black matrix, as shown in FIG. 17A. In accordance with the seventh embodiment, the metal layer 189 is not subjected to an anodization which will be achieved in a manner as the sixth embodiment. In place, a first insulating film 190 is directly deposited over the metal layer 182.

Over the first insulating film 190, another metal layer 182-2 for providing a first gate electrode is deposited, which is, in turn, subjected to a patterning for forming its pattern. Thereafter, another metal layer 182-2 for providing a second gate electrode is deposited over the entire upper surface of the resulting structure, as shown in FIG. 17B. The second gate electrode metal layer 182-2 is subjected to a patterning for forming its pattern with the same line width as the black matrix which will be subsequently formed. Thereafter, an anodization is carried out. By the anodization, the second gate electrode metal layer 182-2 is totally anodized so that it is changed into a transparent anodized film, thereby forming a first gate insulating film 183-1, as shown in FIG. 17C.

By the anodization, the metal layer 182 is also changed into an anodized film, except for its portion disposed beneath the first gate insulating film 183-1, thereby forming a second insulating film 190'. The metal layer 189' remaining at an unanodized state after the anodization becomes the black matrix.

Subsequent processes are the same as those of the fourth embodiment.

In accordance with both the sixth and seventh embodiments, the metal layers and the second gate electrode metal layers are made of an anodizable metal selected from a group consisting of Al, Ta, Ti, Si, V, Nb, Hf, Zr, and alloys thereof. On the other hand, the first gate electrode metal layers are made of a metal passive against the anodization. As the first insulating film 190, a nitride or an oxide film is used.

Figure 18:
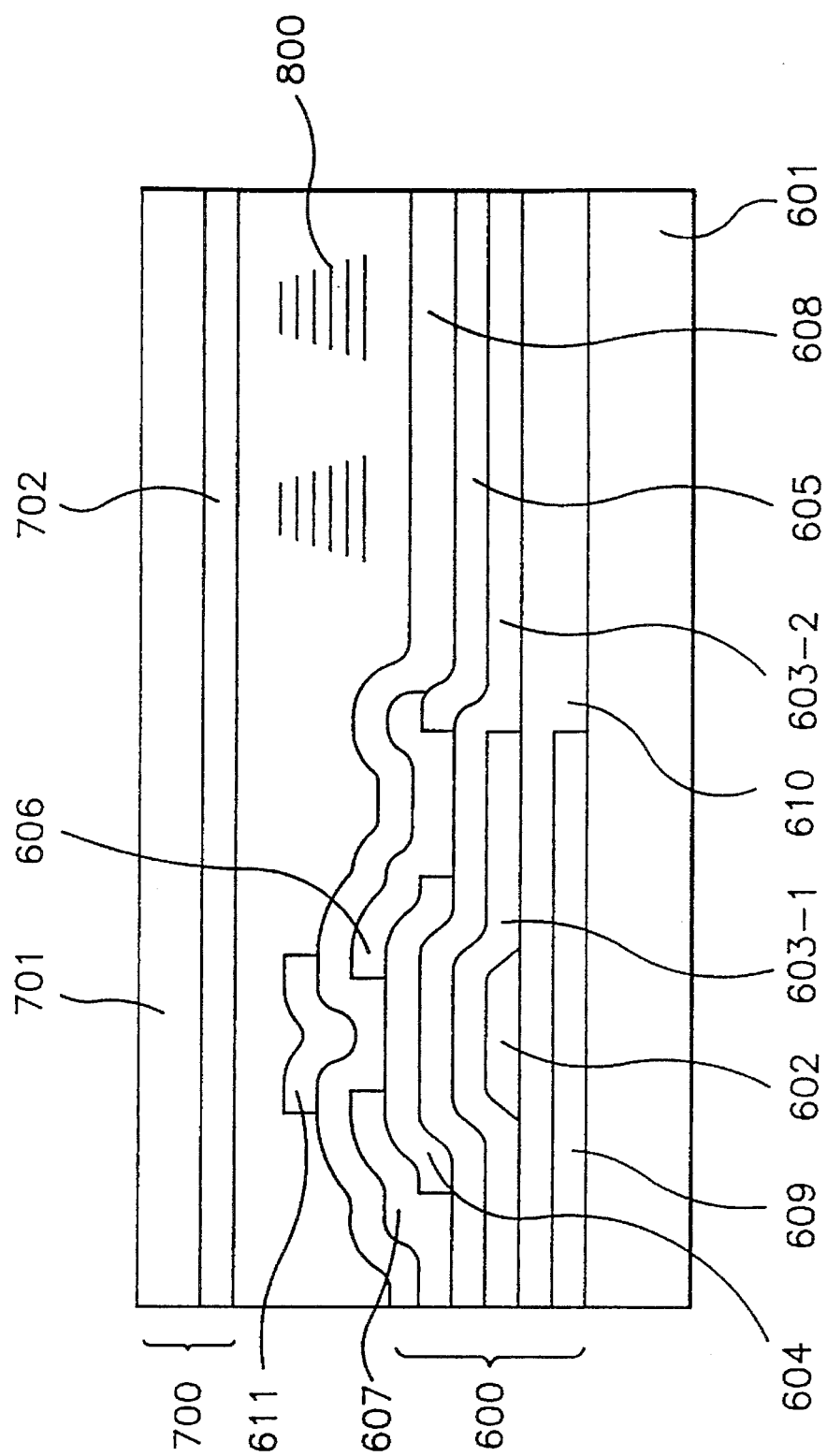
FIG. 18 is a schematic sectional view of a LCD employing the thin film transistor according to the seventh embodiment of the present invention.

FIG. 18 is a schematic sectional view of a LCD employing the thin film transistor according to the seventh embodiment.

As shown in FIG. 18, the LCD comprises a lower plate 600 provided with a black matrix 609 and an upper plate 700. By virtue of the provision of the black matrix 609 at the lower plate 600, the upper plate 700 includes at its lower surface only a transparent electrode 702 formed on an upper insulating substrate 701.

In accordance with the present invention mentioned above, it is possible to prevent a short circuit of gate electrodes due to the small line width of the gate electrodes during an anodization therefor and improve an opening rate.

In accordance with the present invention, it is also possible to greatly reduce the step height caused by the volume expansion upon the anodization and thus prevent a short circuit from occurring at crossing portions of gate electrodes and source/drain electrodes. As a result, the yield of thin film transistors can be improved.

Where the thin film transistor is employed in an LCD, it is also possible to prevent a reduction in opening rate due to a bonding tolerance upon bonding upper and lower plates, in that the black matrix can be provided at the lower insulating substrate, together with the thin film transistor. Consequently, it is possible to prevent a degradation in thin film transistor characteristic due to the radiation and reflection of light beams to the thin film transistor and thus improve the thin film transistor characteristic.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A thin film transistor comprising:
   an insulating substrate;
   a first metal layer formed on said insulating substrate said first metal layer having slanted side walls and a line width of approximately 5 μm;
   a second metal layer formed on said insulating substrate and covering said first metal layer, said second metal layer being anodized to function as a first insulating film having a line width of approximately 20 μm;
   a second insulating film formed over the entire surface of the insulating substrate and the first insulating film;
   an amorphous silicon film formed on one side portion of said second insulating film;
   a pixel electrode formed on the other side portion of the second insulating film;
   a drain electrode formed on the second insulating film overlapping both an upper surface of one side portion of said pixel electrode and an upper surface of one side portion of said amorphous silicon film;
   a source electrode formed on the second insulating film overlapping an upper surface of the other side portion of the amorphous silicon film; and
   a passivation film formed over the entire surface of the resulting structure.

2. A thin film transistor in accordance with claim 1, wherein said first metal layer functions as a gate electrode and is comprised of a non-anodizable metal.

3. A thin film transistor in accordance with claim 1, wherein said second insulating film functions as a second gate insulating film and is comprised of one of a nitride film or an oxide film.

4. A thin film transistor comprising:
   an insulating substrate;
   a metal layer formed on one said portion of said insulating substrate and provided with slant side walls, said metal layer having a predetermined line width;
   a first insulating film formed on the insulating substrate and having a thickness larger than that of the metal layer such that it covers the metal layer, said first insulating film being of a recessed structure;
   a second insulating film formed on the first insulating film and having a recessed upper surface resulting from said recessed structure of the first insulating film;
   an amorphous silicon film formed on said recessed surface of the second insulating film;
   a pixel electrode formed on the second insulating film and spaced a predetermined distance apart from said amorphous silicon film;
   a drain electrode formed on the second insulating film such that it is overlapped with both an upper surface of one side portion of said pixel electrode and an upper surface of one side portion of the amorphous silicon film facing said one side portion of the pixel electrode;
   a source electrode formed on the second insulating film such that it is overlapped with an upper surface of the other side portion of the amorphous silicon film; and
   a passive film formed over the entire upper surfaces of the resulting structure.

5. A thin film transistor in accordance with claim 4, wherein said metal layer serves as a gate electrode and is comprised of an anodizable metal layer.

6. A thin film transistor in accordance with claim 4, wherein said metal layer is made of one selected from a group consisting of Al, Ta, Ti, Si, V, Nb, Hf, Zr, and alloys thereof.

7. A thin film transistor in accordance with claim 4, wherein said first insulating film serves as a first gate insulating film and is comprised of an anodized film.

8. A thin film transistor in accordance with claim 4, wherein said second insulating film serves as a second gate insulating film and is comprised of one of a nitride film or an oxide film.

9. A thin film transistor comprising:
   an insulating substrate;
   a metal layer formed on one side portion of said insulating substrate, said metal layer having a predetermined line width;
   a first insulating film formed on the insulating substrate and having a thickness larger than that of the metal layer such that it covers the metal layer, said first insulating film having a recessed structure at its upper surface portion disposed over the metal layer;
   a second insulating film formed on said recessed upper surface portion of the first insulating film, said second insulating film having the same line width as the metal layer;
   an amorphous silicon film formed on one side portion of the first insulating film such that it covers the second insulating film;
   a pixel electrode formed on the other side portion of the first insulating film;
   a drain electrode formed on the first insulating film such that it is overlapped with both an upper surface of one side portion of said pixel electrode and an upper surface of one side portion of the amorphous silicon film facing said one side portion of the pixel electrode;
   a source electrode formed on the first insulating film such that it is overlapped with an upper surface of the other side portion of the amorphous silicon film; and
   a passive film formed over the entire upper surfaces of the resulting structure.

10. A thin film transistor comprising:
    an insulating substrate;
    a metal layer formed on one side portion of said insulating substrate, said metal layer having a predetermined line width;
    a first insulating film formed on the insulating substrate and having a thickness larger than that of the metal layer such that it covers the metal layer, said first insulating film having a flat upper surface;

a second insulating film formed on one side portion of the first insulating film disposed over the metal layer, said second insulating film having the same line width as the metal layer;

an amorphous silicon film formed on one side portion of the first insulating film such that it covers the second insulating film;

a pixel electrode formed on the other side portion of the first insulating film;

a drain electrode formed on the first insulating film such that it is overlapped with both an upper surface of one side portion of said pixel electrode and an upper surface of one side portion of the amorphous silicon film facing said one side portion of the pixel electrode;

a source electrode formed on the first insulating film such that it is overlapped with an upper surface of the other side portion of the amorphous silicon film; and a passive film formed over the entire upper surfaces of the resulting structure.

11. A thin film transistor in accordance with claim 10, wherein said metal layer is comprised of an anodizable metal layer.

12. A thin film transistor in accordance with claim 11, wherein said anodizable metal layer is one selected from a group consisting of Al, Ta, Ti, Si, V, Nb, Hf, Zr, and alloys thereof.

13. A thin film transistor accordance with claim 10, wherein said first insulating film serves as a first gate insulating film and is comprised of a transparent oxide film.

14. A thin film transistor in accordance with claim 10, wherein said second insulating film serves as a second gate insulating film and is comprised of one of a nitride film or an oxide film.

15. A thin film transistor comprising:

an insulating substrate;

a first metal layer formed on one side portion of said insulating substrate, said first metal layer having a predetermined line width;

a first insulating film formed on the insulating substrate such-that it covers the first metal layer, said first insulating film having a flat upper surface;

a second metal layer formed on said first insulating film above the first metal layer and provided with slant side walls, said second metal layer having a line width smaller than that of the first metal layer;

a second insulating film formed on the first insulating film such that it covers the second metal layer, said second insulating film having the same line width as the first metal layer;

a third insulating film formed over the entire upper surface of the resulting structure;

an amorphous silicon film formed on one side portion of said third insulating film disposed over the second insulating film;

a pixel electrode formed on the other side portion of the third insulating film;

a drain electrode formed on the third insulating film such that it is overlapped with both an upper surface of one side portion of said pixel electrode and an upper surface of one side portion of the amorphous silicon film facing said one side portion of the pixel electrode;

a source electrode formed on the third insulating film such that it is overlapped with an upper surface of the other side portion of the amorphous silicon film;

a passive film formed over the entire upper surfaces of the resulting structure; and a photo-shielding layer formed on said passive layer above the second metal layer.

16. A thin film transistor in accordance with claim 15, wherein said first metal layer serves as a black matrix.

17. A thin film transistor in accordance with claim 16, wherein said first metal layer is comprised of an anodizable metal layer.

18. A thin film transistor in accordance with claim 17, wherein said anodizable metal layer is one selected from a group consisting of Al, Ta, Ti, Si, V, Nb, Hf, Zr, and alloys thereof.

19. A thin film transistor in accordance with claim 15, wherein said first insulating film is comprised of an anodizable metal layer.

20. A thin film transistor in accordance with claim 15, wherein said third insulating film serves as a second gate insulating film and is comprised of one of a nitride film or an oxide film.

21. A thin film transistor in accordance with claim 15, wherein said second metal layer serves as a gate electrode and is comprised of a metal layer passive against an anodization.

22. A thin film transistor comprising:

an insulating substrate;

a first metal layer formed on said insulating substrate and having a first line width;

a second metal layer formed on said insulating substrate and covering said first metal layer, said second metal layer being anodized to function as a first insulating film having a second line width at least two times greater than the first line width of said first metal layer;

a second insulating film formed on said first insulating film and said insulating substrate;

an amorphous silicon film formed on a portion of said second insulating film;

a pixel electrode formed on a portion of said second insulating film;

a drain electrode formed on said second insulating film overlapping both a portion of said pixel electrode and a portion of said amorphous silicon film; and a source electrode formed on said second insulating film overlapping a portion of said amorphous silicon film, wherein the first line width is approximately 5 µm and the second line width is approximately 20 µm.

23. The thin film transistor of claim 22, and further comprising:

a passivation film formed on the entire surface of the thin film transistor.

24. The thin film transistor of claim 22, wherein said first metal layer functions as a gate electrode and is comprises of a non-anodizable metal.

25. The thin film transistor of claim 22, wherein said second insulating film functions as a second gate insulating film and is comprised of a nitride film or an oxide film.

* * * * *